(12) United States Patent
Cao et al.

(10) Patent No.: US 11,696,461 B2
(45) Date of Patent: Jul. 4, 2023

(54) DISPLAY PANEL, MANUFACTURING METHOD AND STRETCHABLE DISPLAY DEVICE

(71) Applicant: BOE Technology Group Co., Ltd., Beijing (CN)

(72) Inventors: Fangxu Cao, Beijing (CN); Jia Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 211 days.

(21) Appl. No.: 17/349,308

(22) Filed: Jun. 16, 2021

(65) Prior Publication Data

US 2022/0140279 A1     May 5, 2022

(30) Foreign Application Priority Data

Nov. 4, 2020 (CN) .......................... 202011218121.5

(51) Int. Cl.
   *H10K 50/84*          (2023.01)
   *H10K 50/86*          (2023.01)
   *H10K 71/00*          (2023.01)
   *H10K 77/10*          (2023.01)

(52) U.S. Cl.
CPC ........... *H10K 50/84* (2023.02); *H10K 50/865* (2023.02); *H10K 71/00* (2023.02); *H10K 77/111* (2023.02)

(58) Field of Classification Search
None
See application file for complete search history.

(56) References Cited

U.S. PATENT DOCUMENTS

| 2014/0145587 | A1 | 5/2014 | Yoon |
| 2019/0067575 | A1* | 2/2019 | Li ........................... H10K 71/00 |
| 2019/0363296 | A1 | 11/2019 | Wang et al. |

(Continued)

FOREIGN PATENT DOCUMENTS

| CN | 104979495 A | 10/2015 |
| CN | 109273515 A | 1/2019 |

(Continued)

OTHER PUBLICATIONS

CN202011218121.5 first office action.

*Primary Examiner* — J. E. Schoenholtz
(74) *Attorney, Agent, or Firm* — IPro, PLLC

(57) ABSTRACT

Disclosed are a display panel, a manufacturing method and a stretchable display device. The display panel includes a rigid substrate; a flexible substrate and an encapsulation layer. The flexible substrate includes a plurality of through-groove structures and at least one through-groove structure includes a non-fixed region and a fixed region surrounding the non-fixed region. A portion of the encapsulation layer located in the at least one through-groove structure includes a first sub-portion located in the fixed region and attached to the rigid substrate and a second sub-portion located in the non-fixed region and attached to the rigid substrate by an organic separation layer, the second sub-portion is configured to be separated from the rigid substrate in a case of gasification of the organic separation layer, and the first sub-portion is configured to be lifted off from the flexible substrate together with the rigid substrate under an external force.

14 Claims, 6 Drawing Sheets

(56) References Cited

U.S. PATENT DOCUMENTS

| | | | |
|---|---|---|---|
| 2021/0125527 A1 | 4/2021 | Ni et al. | |
| 2021/0226161 A1* | 7/2021 | Wang et al. | |
| 2022/0123238 A1* | 4/2022 | Song | H10K 50/844 |
| 2022/0376177 A1* | 11/2022 | Yang | H10K 77/111 |

FOREIGN PATENT DOCUMENTS

| | | |
|---|---|---|
| CN | 110767088 A | 2/2020 |
| CN | 111554831 A | 8/2020 |
| CN | 111864067 A | 10/2020 |
| WO | 2020083308 A1 | 4/2020 |

\* cited by examiner

DISPLAY PANEL, MANUFACTURING METHOD AND STRETCHABLE DISPLAY DEVICE

CROSS REFERENCE TO RELATED APPLICATION

This application is based on and claims priority under 35 U.S.C. 119 to Chinese Patent Application No. 202011218121.5, filed on Nov. 4, 2020, in the China National Intellectual Property Administration. The entire disclosure of the above application is incorporated herein by reference.

FIELD

The disclosure relates to the field of display technology, in particular to a display panel, a manufacturing method and a stretchable display device.

BACKGROUND

Flexible display panels have attracted extensive attention due to their advantages of being foldable, convenient to carry and the like. In particular, stretchable display panels bring brand-new viewing and using experiences to users. A main method for realizing the stretchability of existing flexible display panels is to design holes for polyimide (PI) film substrates. Due to the continuity of encapsulation layers in the holes, the stretchable performance is affected.

SUMMARY

The disclosure provides a display panel, a manufacturing method and a stretchable display device, which are used for improving stretchable performance.

In a first aspect, an embodiment of the disclosure provides a display panel. The display panel includes a rigid substrate, a flexible substrate and an encapsulation layer. The flexible substrate is located on one side of the rigid substrate, and includes a plurality of through-groove structures, and at least one through-groove structure includes a non-fixed region and a fixed region surrounding the non-fixed region. The encapsulation layer is disposed on a side of the flexible substrate facing away from the rigid substrate, wherein a portion of the encapsulation layer located in the at least one through-groove structure includes a first sub-portion located in the fixed region and attached to the rigid substrate and a second sub-portion located in the non-fixed region and attached to the rigid substrate by an organic separation layer, the second sub-portion is configured to be separated from the rigid substrate in a case of gasification of the organic separation layer, and the first sub-portion is configured to be lifted off from the flexible substrate together with the rigid substrate under an external force.

In a second aspect, an embodiment of the disclosure provides a manufacturing method for a stretchable display panel. The method includes:

adhering a flexible substrate to a side of a rigid substrate;
forming a plurality of through-groove structures on the flexible substrate through a photoetching process, wherein at least one through-groove structure includes a non-fixed region and a fixed region surrounding the non-fixed region;
forming a pattern of an organic separation layer on one side of the flexible substrate facing away from the rigid substrate;
forming a whole encapsulation layer on one side of the organic separation layer facing away from the rigid substrate;
according to the pattern of the organic separation layer, forming a first sub-portion attached to the rigid substrate in the fixed region and a second sub-portion attached to the rigid substrate through the organic separation layer in the non-fixed region, of a portion of the encapsulation layer in the at least one through-groove structure;
acting on the rigid substrate through a laser lift-off process, and gasifying the organic separation layer to separate the second sub-portion from the rigid substrate; and
applying an external force on the rigid substrate, forming a breaking point of the encapsulation layer in the fixed region, and lifting off the first sub-portion and the rigid substrate together from the flexible substrate to form the stretchable display panel.

In a third aspect, an embodiment of the disclosure provides a stretchable display device, including: a stretchable display panel manufactured using the manufacturing method as described above.

DESCRIPTION OF DRAWING NUMERALS

Figure 1:
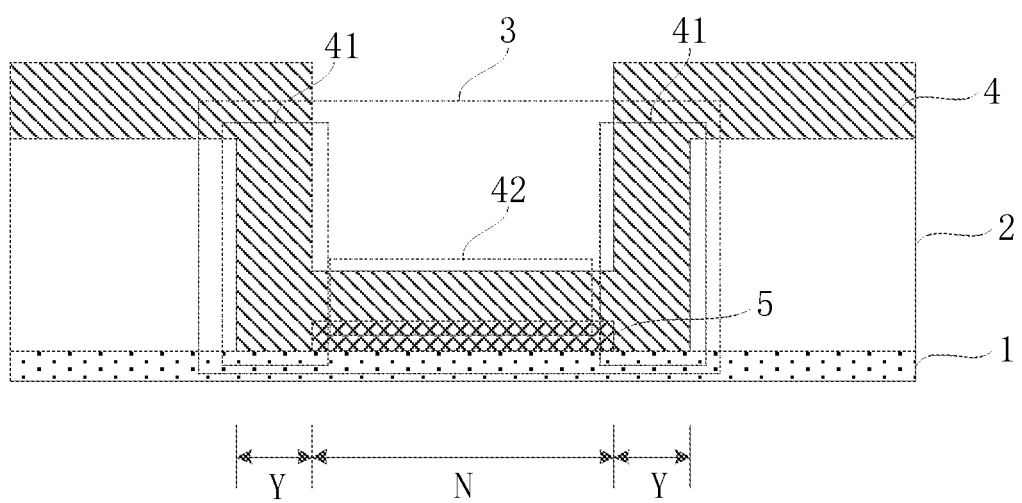
FIG. 1 is a structural schematic diagram of a display panel provided by an embodiment of the disclosure.

1-Rigid Substrate; 2-Flexible Substrate; 3-Through-groove Structure; N-Non-fixed Region; Y-Fixed Region; 4-Encapsulation layer; 41-First Sub-portion; 42-Second Sub-portion; 5-Organic Separation Layer; A-Display Region; B-Non-display Region; 6-Light Shielding Layer; 7-Organic Light-emitting Layer; and 100-Stretchable Display Panel.

DETAILED DESCRIPTION OF THE EMBODIMENTS

In order to make objectives, technical solutions and advantages of embodiments of the disclosure more clear, the technical solutions of the embodiments of the disclosure will be clearly and fully described in combination with the accompanying drawings of the embodiments of the disclosure. Obviously, the described embodiments are some embodiments of the disclosure, rather than all embodiments of the disclosure. Meanwhile, embodiments of the disclosure and features of the embodiments may be combined with one another without conflict. Based on the described embodiments of the disclosure, all other embodiments attainable by those ordinarily skilled in the art without any creative effort are within the scope of the disclosure.

Unless defined otherwise, technical or scientific terms used in the disclosure shall have the ordinary meaning as understood by those ordinarily skilled in the art to which the disclosure belongs. The word "include" or "comprise", and other similar words, mean that an element or article that precedes the word is inclusive of an element or article listed after the word and equivalents thereof, but does not exclude other elements or articles.

It should be noted that dimensions and shapes of various figures in the drawings are not to scale and are intended to be merely illustrative of the disclosure. The same or similar reference numerals refer to the same or similar elements or elements having the same or similar functions throughout.

In the related art, a laser lift-off technology is often required in order to lift off a rigid substrate during manufacture of a stretchable display panel. In addition, an organic light-emitting material of the stretchable display panel is often deposited in the whole surface by using an open mask. In this way, during laser lift-off operation, an organic light-emitting material located in an Active Area (AA) will be gasified, causing TFE to separate from the rigid substrate, at which point the continuity of the TFE of an encapsulation layer in a hole greatly affects the stretchable performance. In the process of further lifting off the encapsulation layer in the hole, due to the fact that an area of the encapsulation layer in the hole is large, stress is large when the encapsulation layer is separated, the encapsulation layer is prone to cracking, packaging failure is caused, and the display quality is reduced.

Therefore, embodiments of the disclosure provide a display panel, a manufacturing method and a stretchable display device, which are used for improving the stretchable performance while considering the display quality.

FIG. 1 is a structural schematic diagram of a display panel provided by an embodiment of the disclosure. The display panel includes:

a rigid substrate 1; a flexible substrate 2 located on one side of the rigid substrate 1, wherein the flexible substrate 2 includes a plurality of through-groove structures 3, and at least one through-groove structure 3 includes a non-fixed region N and a fixed region Y surrounding the non-fixed region N; and an encapsulation layer 4 on one side of the flexible substrate 2 facing away from the rigid substrate 1, where a portion of the encapsulation layer 4 located in the at least one through-groove structure 3 includes a first sub-portion 41 located in the fixed region Y and attached to the rigid substrate 1 and a second sub-portion 42 located in the non-fixed region N and attached to the rigid substrate 1 via an organic separation layer 5. The second sub-portion 42 is configured to be separated from the rigid substrate 1 in a case of gasification of the organic separation layer 5, and the first sub-portion 41 is configured to be lifted off from the flexible substrate 2 together with the rigid substrate 1 under an external force.

That is, by disposing the organic separation layer in the non-fixed region of the through-groove structure, when the organic separation layer is gasified, the second sub-portion of the encapsulation layer located in the non-fixed region is separated from the rigid substrate, and the first sub-portion and the rigid substrate are lifted off from the flexible substrate together under the external force. Therefore, the portion of the encapsulation layer located in the through-groove structure can be removed, and accordingly the stretchable performance is ensured.

In the embodiment of the disclosure, the rigid substrate 1 may be a glass-based substrate or a silicon-based substrate, which is not limited herein. The flexible substrate 2 may be a substrate made of a PI material.

It should be noted that, generally in the manufacture of the display panel as shown in FIG. 1, the stretchable display panel is carried on the rigid substrate 1 as shown in FIG. 1 for the manufacture of relevant film layers, and after the manufacture is completed, the stretchable display panel needs to be lifted off from the rigid substrate 1.

Figure 2:
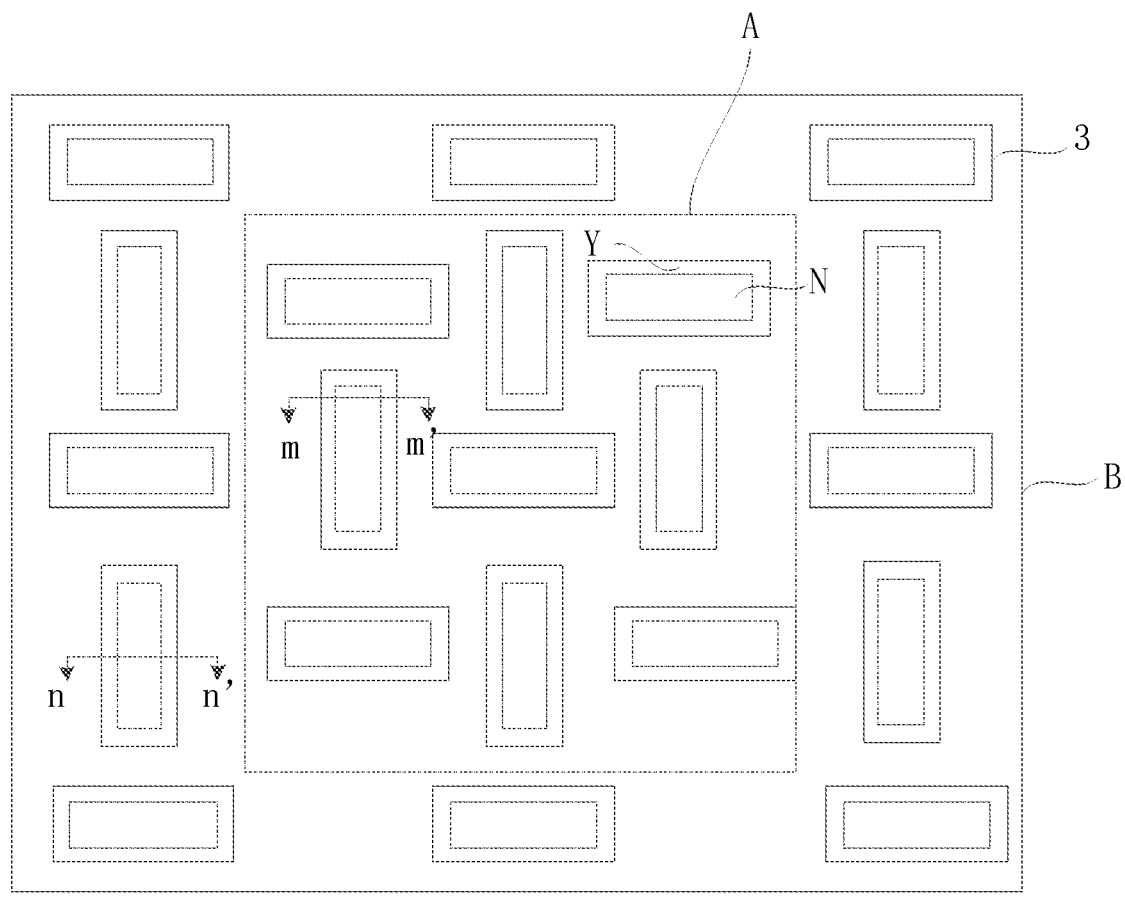
FIG. 2 is a schematic diagram showing one distribution of a plurality of through-groove structures in a display panel provided by an embodiment of the disclosure.

In some embodiments, the flexible substrate 2 includes the plurality of through-groove structures 3, one distribution of the plurality of through-groove structures 3 is as shown in FIG. 2. FIG. 2 only illustrates a case where a shape of cross-sectional view of the through-groove structures 3 parallel to the flexible substrate 2 is rectangular. The shape of the through-groove structures may also be set according to practical needs, which is not limited herein. In addition, at least one through-groove structure 3 in the plurality of through-groove structures 3 includes the non-fixed region N and the fixed region Y surrounding the non-fixed region N, that is, it may be that all the through-groove structures 3 in the plurality of through-groove structures 3 are provided with the non-fixed region N and the fixed region Y, and it may also be that part of the through-groove structures 3 are each provided with the non-fixed region N and the fixed region Y, which is not limited herein. FIG. 1 only illustrates one through-groove structure 3, one non-fixed region N and one fixed region Y for example.

In some embodiments, the display panel further includes the encapsulation layer 4 on one side of the flexible substrate 2 facing away from the rigid substrate 1, the encapsulation layer 4 may include two inorganic insulating layers and an organic insulating layer between the two inorganic insulating layers, and external water and oxygen are effectively isolated through the encapsulation layer 4, so that performance of the display panel is improved. The portion of the encapsulation layer 4 located in the at least one through-groove structure 3 includes the first sub-portion 41 located in the fixed region Y and attached to the rigid substrate 1 and the second sub-portion 42 located in the non-fixed region N and attached to the rigid substrate 1 by the organic separation layer 5, that is, the portion of the encapsulation layer 4 located in the at least one through-groove structure 3 includes the first sub-portion 41 located in the fixed region Y and the second sub-portion 42 located in the non-fixed region N. In this case, as the organic separation layer 5 in the non-fixed region N is located between the second sub-portion 42 and the rigid substrate 1, when applying the laser lift-off technology to the rigid substrate 1, the organic separation layer is gasified, and the second sub-portion 42 is separated from the rigid substrate 1, so that during subsequent manufacture of the stretchable display panel, the first sub-portion 41 is lifted off from the flexible substrate 2 together with the rigid substrate 1 under the external force, and after lifting off, the stretchable performance of the stretchable display panel is greatly improved.

Figure 3:
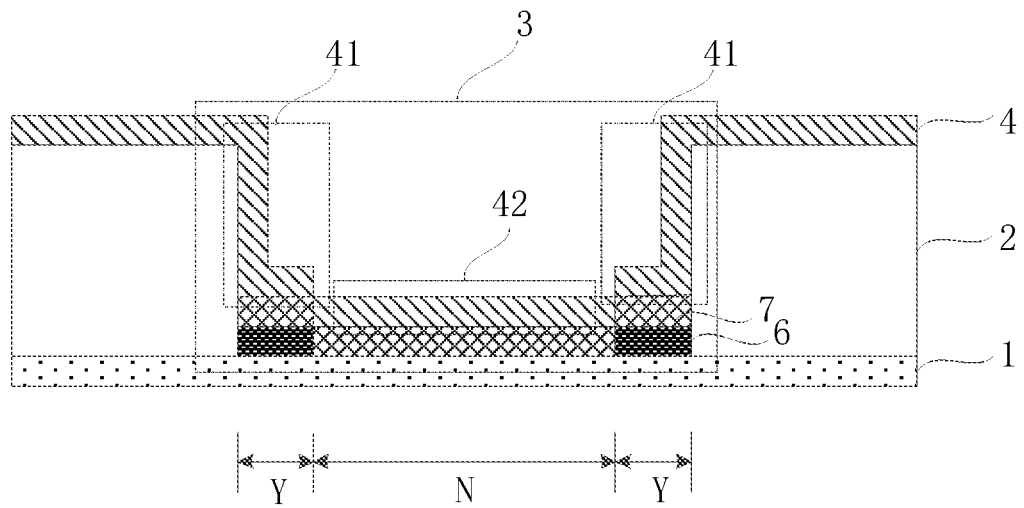
FIG. 3 is a schematic diagram of one sectional view of a display panel along a direction indicated by line mm' in FIG. 2 provided by an embodiment of the disclosure.

In the embodiment of the disclosure, the flexible substrate 2 includes a display region A and a non-display region B surrounding the display region A. FIG. 2 only illustrates one schematic diagram of one distribution of the non-display region B and the display region A. In some embodiments, FIG. 3 is a schematic diagram of one sectional view of the display panel in a direction indicated by line mm' in FIG. 2. In the display region A, the display panel further includes a light shielding layer 6, located between the first sub-portion 41 and the rigid substrate 1, so that when applying the laser lift-off technology to the rigid substrate 1, the first sub-portion 41 is effectively shielded by the light shielding layer 6, the firmness of attachment among the first sub-portion 41, the light shielding layer 6 and the rigid substrate is guaranteed, the first sub-portion 41 and the rigid substrate 1 are conveniently lifted off from the flexible substrate 2 together later, and the preparation efficiency of the display panel is improved.

In the embodiment of the disclosure, in the display region A, the organic separation layer 5 serves as an organic light-emitting layer 7, and the organic light-emitting layer 7 is between the light shielding layer 6 and the first sub-portion 41. In this way, when the rigid substrate 1 applied with the laser lift-off technology, the light shielding layer 6 effectively shields the portion of the organic light-emitting layer 7 located in the fixed region Y, so that the portion of the organic light-emitting layer 7 located in the fixed region Y is not gasified, attachment between the first sub-portion 41 and the rigid substrate 1 is relatively firm, and a breaking point of the encapsulation layer 4 may be formed at the fixed region Y when the rigid substrate 1 is lifted off subsequently. The portion of the organic light-emitting layer 7 located in the non-fixed region N is attached to the rigid substrate 1, so that the portion of the organic light-emitting layer 7 located in the non-fixed region N is gasified to separate the second sub-portion 42 from the rigid substrate 1.

In the embodiment of the disclosure, the light shielding layer 6 is made of a metal material or an inorganic material. The inorganic material may be silicon oxide, silicon nitride, etc., which is not limited herein. Since the light shielding layer 6 is located between the organic light-emitting layer 7 and the rigid substrate 1 in the fixed region Y, the light-shielding layer 6 effectively shields the organic light-emitting layer 7 when the rigid substrate 1 is applied with the laser lift-off technology subsequently, thereby ensuring the firmness of bonding between the first sub-portion 41 and the rigid substrate 1.

Figure 4:
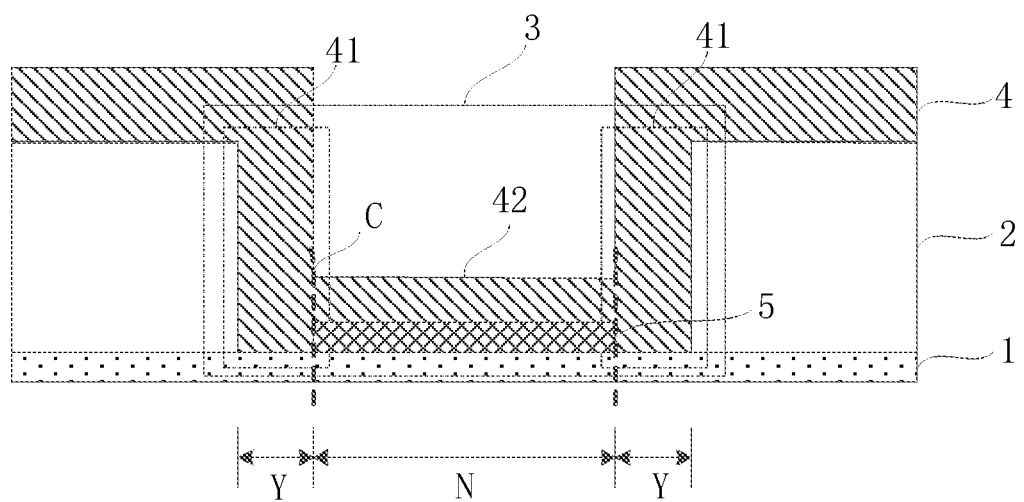
FIG. 4 is a schematic diagram of one sectional view of a display panel in along direction indicated by line nn' in FIG. 2 provided by an embodiment of the disclosure.

In the embodiment of the disclosure, FIG. 4 is a schematic diagram of one sectional view of a display panel in a direction indicated by line nn' in FIG. 2. Specifically, in the non-display region B, the first sub-portion 41 is directly attached to the rigid substrate 1, since no organic light-emitting material may be provided in the through-groove structure 3 in the non-display region B, the first sub-portion 41 is directly attached to the rigid substrate 1, and even when the rigid substrate 1 is applied with the laser lift-off technology, attachment between the first sub-portion 41 and the rigid substrate 1 is still relatively firm, so that when the rigid substrate 1 is subsequently lifted off, a breaking point of the encapsulation layer 4 may be formed at the fixed region Y, as shown by a dotted line C in FIG. 4. In addition, the organic separation layer 5 may be disposed as a separation sacrificial layer in the non-fixed region, thereby ensuring that the second sub-portion 42 is separated from the rigid substrate 1 during laser lifting off.

In the embodiment of the disclosure, further as shown in FIG. 4, in the non-display region B, the flexible substrate 2 forms the organic separation layer 5 by reserving a partial region in the through-groove structure 3, and a thickness of the organic separation layer 5 is smaller than a thickness of the flexible substrate 2.

In some embodiments, while the through-groove structure 3 is manufactured, the partial region is reserved in the through-groove structure 3 to form the organic separation layer 5, so that the organic separation layer 5 and the flexible substrate 2 may be manufactured together, thereby reducing manufacturing cost and improving manufacturing efficiency. A material of the organic separation layer 5 may be a PI. The thickness of the organic separation layer 5 is smaller than that of the flexible substrate 2, for example, the thickness of the organic separation layer 5 is h1, and the thickness of the flexible substrate 2 is h2.

In the embodiment of the disclosure, further as shown in FIG. 1, an area of an orthographic projection of the fixed region Y on the flexible substrate 2 is smaller than an area of an orthographic projection of the non-fixed region N on the flexible substrate 2. Therefore, stress during lifting off may be reduced, cracks caused by excessive stress of the encapsulation layer 4 are avoided, the packaging performance is guaranteed, and the display quality is guaranteed.

Furthermore, in some embodiments, the arrangement of other relevant film layers on the display panel is the same as in the prior art and will not be described in detail here.

Figure 5:
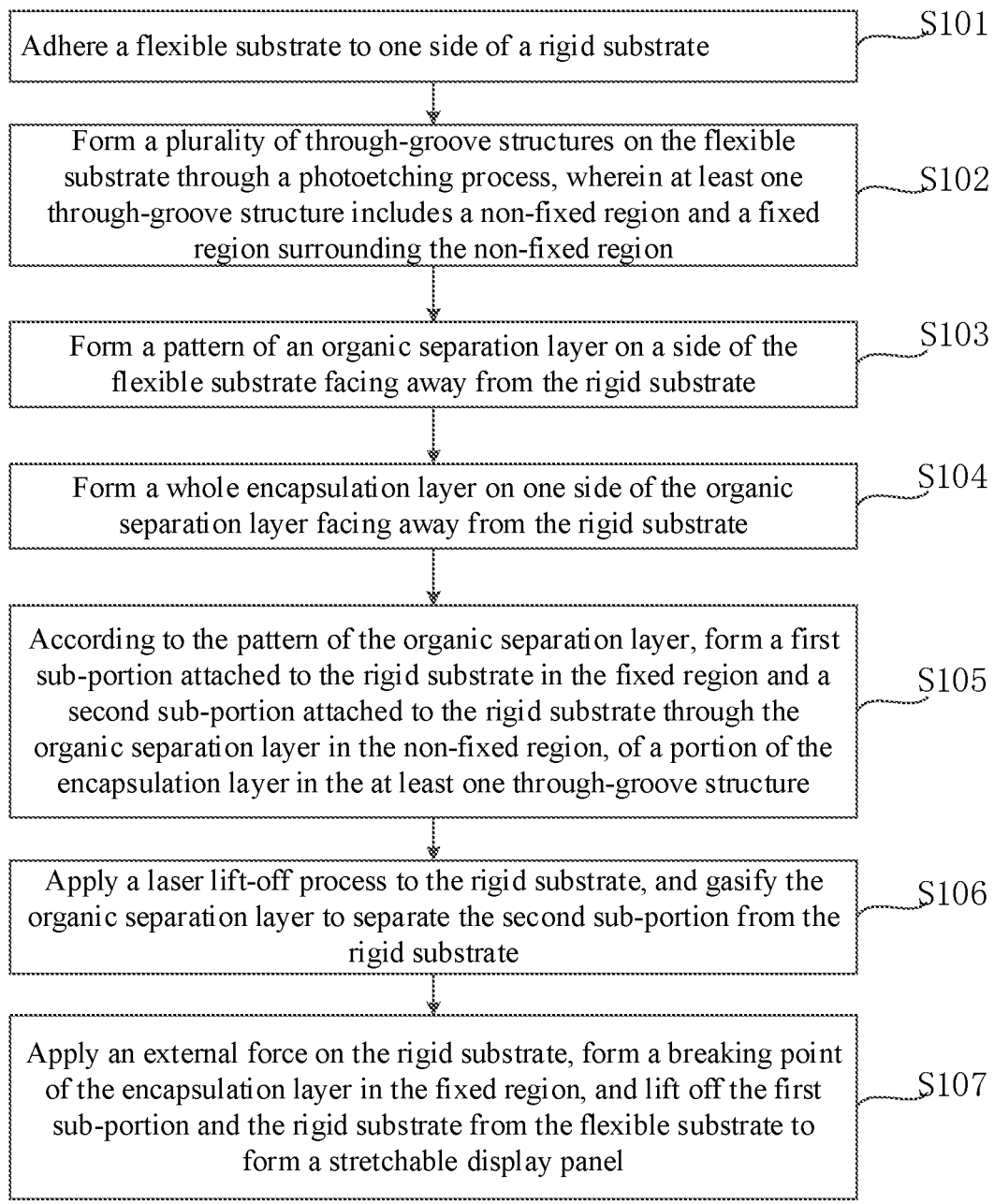
FIG. 5 is a flowchart of a manufacturing method for a stretchable display panel provided by an embodiment of the disclosure.

Based on the same inventive concept, as shown in FIG. 5, an embodiment of the disclosure also provides a manufacturing method of a stretchable display panel, including the following steps.

S101: adhering a flexible substrate to one side of a rigid substrate.

S102: forming a plurality of through-groove structures in the flexible substrate by photoetching process, at least one through-groove structure including a non-fixed region and a fixed region surrounding the non-fixed region.

In some embodiments, the photoetching technology may be a manufacturing process in the prior art and will not be described in detail herein.

S103: forming a pattern of an organic separation layer on one side of the flexible substrate facing away from the rigid substrate.

S104: forming a whole encapsulation layer on one side of the organic separation layer facing away from the rigid substrate.

S105: according to the pattern of the organic separation layer, forming a first sub-portion of a portion of the encapsulation layer in the at least one through-groove structure attached to the rigid substrate in the fixed region and a second sub-portion of the portion of the encapsulation layer in the at least one through-groove structure attached to the rigid substrate through the organic separation layer in the non-fixed region.

S106: applying a laser lift-off process on the rigid substrate, and gasifying the organic separation layer to separate the second sub-portion from the rigid substrate.

S107: applying an external force on the rigid substrate, forming a breaking point of the encapsulation layer in the fixed region, and forming the stretchable display panel by lifting off the first sub-portion, the second sub-portion and the rigid substrate from the flexible substrate.

In some embodiments, when the external force acts on the rigid substrate, the breaking point of the encapsulation layer 4 is formed in the fixed region Y, so that the portion of the encapsulation layer 4 located in the through-groove structure 3 is divided into two independent portions, that is, the first sub-portion 41 and the second sub-portion 42 are separated from the flexible substrate 2, the encapsulation layer 4 in the through-groove structure 3 may be removed, and accordingly the stretchable performance of the stretchable display panel is ensured.

Figure 6:
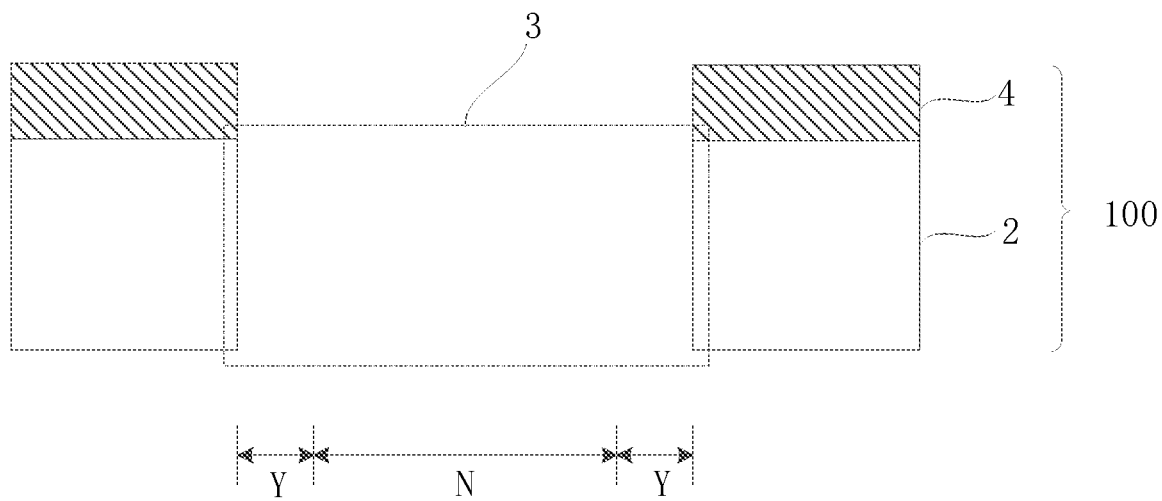
FIG. 6 is a schematic diagram of one structure of a stretchable display panel manufactured by the manufacturing method shown in FIG. 5.

After the manufacturing method shown in FIG. 5 is adopted, the stretchable display panel 100 may be one structural schematic diagram shown in FIG. 6, which illustrates a case where the stretchable display panel 100 includes only one through-groove structure 3, and for a case where the through-groove structures 3 are multiple, each through-groove structure 3 does not include any film layer structure therein as shown in FIG. 6. The stretchable display panel 100 manufactured by the manufacturing method shown in FIG. 5 has good stretchable performance.

Figure 7:
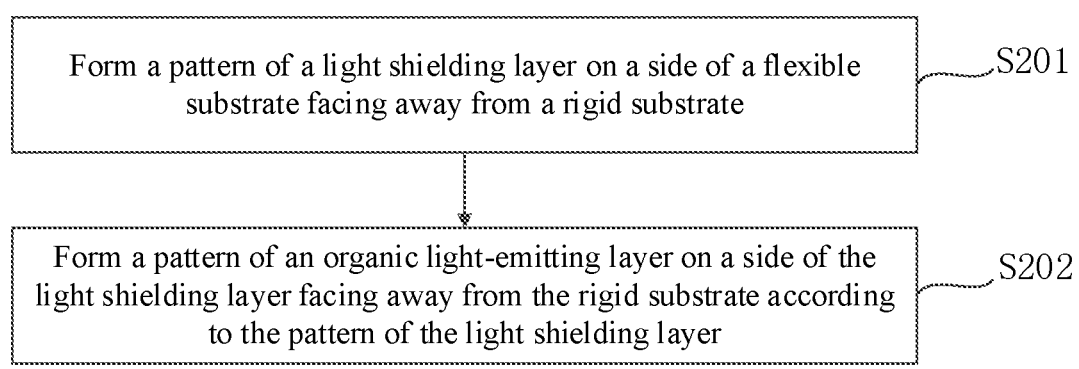
FIG. 7 is a flowchart of step S103 in a manufacturing method for a stretchable display panel provided by an embodiment of the disclosure.

In the embodiment of the disclosure, the flexible substrate 2 includes a display region A and a non-display region B surrounding the display region A, in the display region A, the organic separation layer 5 is an organic light-emitting layer 7, and as shown in FIG. 7, forming the pattern of the organic separation layer on one side of the flexible substrate facing away from the rigid substrate in S103, includes the following steps.

S201: forming a pattern of a light shielding layer on one side of the flexible substrate facing away from the rigid substrate.

S202: forming a pattern of the organic light-emitting layer on one side of the light shielding layer facing away from the rigid substrate according to the pattern of the light shielding layer.

In the embodiment of the disclosure, when forming the plurality of through-groove structures on the flexible substrate through the photoetching technology, the method further includes:

in the non-display region, forming the organic separation layer by reserving a part of the flexible substrate in the through-groove structure, where a thickness of the organic separation layer is smaller than a thickness of the flexible substrate.

In some embodiments, the through-groove structure 3 may be manufactured by adopting the photoetching process, and the partial region is reserved in the through-groove structure 3 and not etched, so that the reserved partial region forms the organic separation layer 5.

Figure 8:
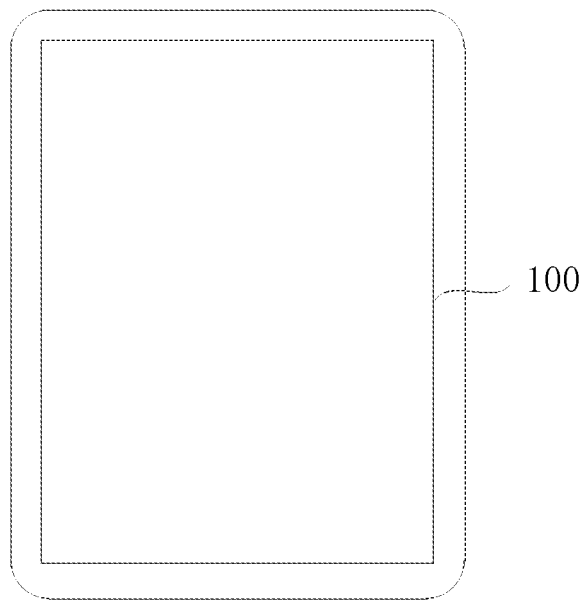
FIG. 8 is a structural schematic diagram of a stretchable display device provided by an embodiment of the disclosure.

Based on the same inventive concept, as shown in FIG. 8, an embodiment of the disclosure further provides a stretchable display device including the stretchable display panel 100 manufactured using the manufacturing method as shown in FIG. 5, which solves the problem in a manner similar to that of the above-mentioned stretchable display panel 100, so that implementation of the display device may be seen in the implementation of the above-mentioned stretchable display panel 100 and will not be repeated here.

In some embodiments, the stretchable display device provided by the embodiment of the disclosure may be a mobile phone, and may also be any product or component with a display function, such as a tablet computer, a television, a display, a notebook computer, a digital photo frame, and a navigator. Other essential components of the stretchable display device will be apparent to those ordinarily skilled in the art and will not be described in detail herein, nor should they be construed as limiting the disclosure.

Although preferable embodiments of the disclosure have been described, additional variations and modifications of these embodiments will be made to those skilled in the art upon attaining the basic inventive concept. It is therefore intended that the appended claims be interpreted as including the preferable embodiments and all such variations and modifications as falling within the scope of the disclosure.

It will be apparent to those skilled in the art that various modifications and variations can be made in the disclosure without departing from the spirit or scope of the disclosure. Thus, it is intended that the disclosure covers the modifications and variations provided they come within the scope of the appended claims and their equivalents.

What is claimed is:

1. A display panel, comprising:
a rigid substrate;
a flexible substrate on a side of the rigid substrate;
wherein the flexible substrate comprises a plurality of through-groove structures, and at least one of the plurality of through-groove structure comprises a non-fixed region and a fixed region surrounding the non-fixed region; and
an encapsulation layer on a side of the flexible substrate facing away from the rigid substrate;
wherein a portion of the encapsulation layer in the at least one of the plurality of through-groove structure comprises a first sub-portion in the fixed region and attached to the rigid substrate and a second sub-portion in the non-fixed region and attached to the rigid substrate via an organic separation layer;
the second sub-portion is configured to be separated from the rigid substrate in a case of gasification of the organic separation layer; and
the first sub-portion is configured to be lifted off from the flexible substrate together with the rigid substrate under an external force.

2. The display panel according to claim 1, wherein the flexible substrate comprises a display region and a non-display region surrounding the display region; and
in the display region, the display panel further comprises a light shielding layer disposed between the first sub-portion and the rigid substrate.

3. The display panel according to claim 2, wherein the organic separation layer is an organic light-emitting layer, the organic light-emitting layer is disposed between the light shielding layer and the first sub-portion, and the light shielding layer is made of a metal material or an inorganic material.

4. The display panel according to claim 2, wherein in the non-display region, the first sub-portion is directly attached to the rigid substrate.

5. The display panel according to claim 4, wherein in the non-display region, a part of the flexible substrate in the through-groove structure is reserved as the organic separation layer, and a thickness of the organic separation layer is smaller than a thickness of the flexible substrate.

6. The display panel according to claim 1, wherein an area of an orthographic projection of the fixed region on the flexible substrate is smaller than an area of an orthographic projection of the non-fixed region on the flexible substrate.

7. The display panel according to claim 1, wherein at least one of the plurality of through-groove structure comprises a non-fixed region and a fixed region surrounding the non-fixed region comprises:
the plurality of through-groove structure each comprises a non-fixed region and a fixed region surrounding the non-fixed region.

8. The display panel according to claim 1, wherein at least one of the plurality of through-groove structure comprises a non-fixed region and a fixed region surrounding the non-fixed region comprises:
a part of the plurality of through-groove structure comprise a non-fixed region and a fixed region surrounding the non-fixed region.

9. The display panel according to claim 1, wherein the organic separation layer is made of Polyimide.

10. The display panel according to claim 1, wherein the display panel is an Organic Light Emitting Diode (OLED) panel.

11. A manufacturing method of a stretchable display panel, comprising:
    adhering a flexible substrate to a side of a rigid substrate;
    forming a plurality of through-groove structures on the flexible substrate through a photoetching process, wherein at least one through-groove structure comprises a non-fixed region and a fixed region surrounding the non-fixed region;
    forming a pattern of an organic separation layer on a side of the flexible substrate facing away from the rigid substrate;
    forming a whole encapsulation layer on a side of the organic separation layer facing away from the rigid substrate;
    according to the pattern of the organic separation layer, forming, a first sub-portion attached to the rigid substrate in the fixed region and a second sub-portion attached to the rigid substrate via the organic separation layer in the non-fixed region, of a portion of the encapsulation layer in the at least one through-groove structure;
    applying a laser lift-off process on the rigid substrate, and gasifying the organic separation layer to separate the second sub-portion from the rigid substrate; and
    applying an external force on the rigid substrate, forming a breaking point of the encapsulation layer in the fixed region, and lifting off the first sub-portion and the rigid substrate together from the flexible substrate to form the stretchable display panel.

12. The manufacturing method according to claim 11, wherein the flexible substrate comprises a display region and a non-display region surrounding the display region, in the display region, the organic separation layer is an organic light-emitting layer, and forming the pattern of the organic separation layer on the side of the flexible substrate facing away from the rigid substrate, comprises:
    forming a pattern of a light shielding layer on the side of the flexible substrate facing away from the rigid substrate; and
    forming the pattern of the organic light-emitting layer on a side of the light shielding layer facing away from the rigid substrate according to the pattern of the light shielding layer.

13. The method according to claim 12, wherein when forming the plurality of through-groove structures on the flexible substrate by the photoetching process, the method further comprises:
    in the non-display region, forming the organic separation layer by reserving a part of the flexible substrate in the through-groove structure, wherein a thickness of the organic separation layer is smaller than a thickness of the flexible substrate.

14. A stretchable display device, comprising:
    a stretchable display panel manufactured by using the manufacturing method according to claim 11.

* * * * *